(12) United States Patent
Takeuchi et al.

(10) Patent No.: US 10,128,816 B2
(45) Date of Patent: Nov. 13, 2018

(54) HIGH-FREQUENCY MODULE

(71) Applicant: Murata Manufacturing Co., Ltd., Nagaokakyo-shi, Kyoto-fu (JP)

(72) Inventors: Morio Takeuchi, Nagaokakyo (JP); Koichiro Kawasaki, Nagaokakyo (JP); Yohei Konaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 168 days.

(21) Appl. No.: 15/205,090

(22) Filed: Jul. 8, 2016

(65) Prior Publication Data
US 2016/0322956 A1    Nov. 3, 2016

Related U.S. Application Data

(63) Continuation of application No. PCT/JP2014/077376, filed on Oct. 15, 2014.

(30) Foreign Application Priority Data

Jan. 10, 2014    (JP) .................................. 2014-002803

(51) Int. Cl.
*H03H 9/72*    (2006.01)
*H03H 9/64*    (2006.01)
(Continued)

(52) U.S. Cl.
CPC ............... *H03H 9/725* (2013.01); *H03H 7/09* (2013.01); *H03H 9/0009* (2013.01);
(Continued)

(58) Field of Classification Search
CPC ...... H03H 7/09; H03H 9/0009; H03H 9/0542; H03H 9/059; H03H 9/1071; H03H 9/6433;
(Continued)

(56) References Cited

U.S. PATENT DOCUMENTS 7,583,161 B2 *    9/2009    Tanaka ................. H03H 9/0576
333/133
2007/0046394 A1    3/2007    Inoue et al.
(Continued)

FOREIGN PATENT DOCUMENTS

JP    2007-60412 A    3/2007
JP    2009-290606 A    12/2009
(Continued)

OTHER PUBLICATIONS

Official Communication issued in International Application PCT/JP2014/077376, dated Jan. 13, 2015.

*Primary Examiner* — Robert J Pascal
*Assistant Examiner* — Jorge Salazar, Jr.
(74) *Attorney, Agent, or Firm* — Keating & Bennett, LLP

(57) ABSTRACT

In a high frequency module, in addition to a main transmission path in which a high-frequency signal propagates in first filter elements, a sub transmission path is defined by inductive coupling or capacitive coupling between a first inductor and a matching element or by inductive coupling between the first inductor and a second inductor. The sub transmission path has different amplitude characteristics and phase characteristics from those of the main transmission path depending on a degree of the inductive coupling or capacitive coupling, and transmission characteristics as a high-frequency module are adjustable by adjusting the amplitude characteristics and the phase characteristics of the sub transmission path.

21 Claims, 11 Drawing Sheets

(51) Int. Cl.
| | |
|---|---|
| *H03H 9/05* | (2006.01) |
| *H03H 9/10* | (2006.01) |
| *H03H 9/00* | (2006.01) |
| *H05K 1/02* | (2006.01) |
| *H03H 7/09* | (2006.01) |

(52) U.S. Cl.
CPC .......... *H03H 9/059* (2013.01); *H03H 9/0542* (2013.01); *H03H 9/1071* (2013.01); *H03H 9/6433* (2013.01); *H03H 9/6483* (2013.01); *H05K 1/0243* (2013.01); *H05K 1/0298* (2013.01); *H05K 2201/1006* (2013.01)

(58) Field of Classification Search
CPC .... H03H 9/6483; H03H 9/725; H05K 1/0243; H05K 1/0298; H05K 2201/1006
USPC .......................................... 333/133, 193–196
See application file for complete search history.

(56) References Cited

U.S. PATENT DOCUMENTS

| | | |
|---|---|---|
| 2009/0147707 A1 | 6/2009 | Koga et al. |
| 2012/0119847 A1 | 5/2012 | Iwaki et al. |
| 2012/0286895 A1 | 11/2012 | Hara et al. |
| 2014/0118084 A1 | 5/2014 | Takemura |

FOREIGN PATENT DOCUMENTS

| | | |
|---|---|---|
| JP | 2012-239039 A | 12/2012 |
| WO | 2007/102560 A1 | 9/2007 |
| WO | 2011/089746 A1 | 7/2011 |
| WO | 2013/008435 A1 | 1/2013 |

\* cited by examiner

HIGH-FREQUENCY MODULE

CROSS REFERENCE TO RELATED APPLICATIONS

This application claims the benefit of priority to Japanese Patent Application 2014-002803 filed Jan. 10, 2014 and is a Continuation Application of PCT/JP2014/077376 filed on Oct. 15, 2014. The entire contents of each application are hereby incorporated by reference.

BACKGROUND OF THE INVENTION

1. Field of the Invention

The present invention relates to a high-frequency module including a plurality of filter elements.

2. Description of the Related Art

In mobile devices and the like having wireless communication functions, a filter circuit is used to allow only a high-frequency signal at a desired frequency to pass and attenuate high-frequency signals at frequencies aside from the desired frequency.

For example, Japanese Unexamined Patent Application Publication No. 2012-109818 discloses a filter circuit including a plurality of SAW (surface acoustic wave) filters. Specifically, in the filter circuit according to Japanese Unexamined Patent Application Publication No. 2012-109818, the plurality of SAW filters are connected in series between an input terminal and an output terminal. SAW filters are also connected between connection lines that connect the SAW filters connected in series and grounds.

The filter circuit disclosed in Japanese Unexamined Patent Application Publication No. 2012-109818 includes an inductor or a series circuit constituted of an inductor and a capacitor (called a correction circuit) connected in parallel to the SAW filter series circuit in order to improve attenuation characteristics outside of the pass band. At this time, the correction circuit is adjusted so that a high-frequency signal outside of the pass band (a suppression target signal) propagating in a circuit section constituted by the SAW filter group and the suppression target signal propagating in the correction circuit have the same amplitude and inverted phases against each other. As a result, the suppression target signals cancel each other out at a connection point between the circuit section constituted by the SAW filter group and the correction circuit and are not outputted from the output terminal.

However, in the above-described structure, it is necessary to provide the correction circuit, including an inductor or a series circuit constituted of an inductor and a capacitor, simply to improve the attenuation characteristics, in addition to the circuit section constituted of the SAW filter group providing the main filter function.

This increases the number of constituent elements in the filter circuit and thus increases the size of the filter circuit, and is therefore unsuitable for current mobile terminals and the like, which require increased miniaturization.

SUMMARY OF THE INVENTION

Preferred embodiments of the present invention provide a high-frequency module including a filter circuit that achieves superior attenuation characteristics outside a pass band.

A preferred embodiment of the present invention relates to a high-frequency module including a first external connection terminal, a second external connection terminal, a filter section connected between the first external connection terminal and the second external connection terminal, and a matching element connected between the filter section and at least one of the first external connection terminal and the second external connection terminal, and includes the following features.

The filter section includes a first connection terminal connected to the first external connection terminal, a second connection terminal connected to the second external connection terminal, and a plurality of first filter elements connected in series between the first connection terminal and the second connection terminal; the high-frequency module further includes a first inductor connected in parallel to the first filter element aside from the first filter element connected to the matching element through the first connection terminal or the second connection terminal; and the first inductor and the matching element are inductively coupled or capacitively coupled.

According to this structure, in addition to a main transmission path in which a high-frequency signal propagates in the plurality of first filter elements, a sub transmission path is defined by inductive coupling or capacitive coupling occurring between the first inductor and the matching element. The sub transmission path has different amplitude characteristics and phase characteristics from those of the main transmission path depending on a degree of the inductive coupling or capacitive coupling, and transmission characteristics as a high-frequency module are adjustable by adjusting the amplitude characteristics and the phase characteristics of the sub transmission path. As a result, the transmission characteristics of the high-frequency module are able to be adjusted, for example, to improve attenuation characteristics, without providing a separate inductor, capacitor, or the like.

A sub transmission path according to a preferred embodiment of the present invention is also provided by constructing a high-frequency module as follows. A filter section includes a first connection terminal connected to the first external connection terminal; a second connection terminal connected to the second external connection terminal; a third connection terminal connected to a ground; a plurality of first filter elements connected in series between the first connection terminal and the second connection terminal; and a second filter element connected at one end to a connection line connecting the first connection terminal and the first filter element, a connection line connecting the second connection terminal and the first filter element, or a connection line connecting mutually-adjacent first filter elements, and connected at another end to the third connection terminal.

The high-frequency module further includes a first inductor connected in parallel to the first filter element and a second inductor connected between the third connection terminal and the ground, and the first inductor and the second inductor are inductively coupled.

The sub transmission path is able to be provided by the inductive coupling between the first inductor and the second inductor when the high-frequency module is constructed in this manner as well.

In addition, the filter section may include a fourth connection terminal and a fifth connection terminal, and the first inductor may be connected in parallel to the first filter element through the fourth connection terminal and the fifth connection terminal.

Disposing the first inductor outside of the filter section using the fourth connection terminal and the fifth connection terminal makes it easy to dispose and provide the first inductor, which in turn makes it easy to adjust the characteristics of the sub transmission path.

In addition, inductive coupling or capacitive coupling produced by the first inductor may change impedance outside a pass band of the filter section.

As indicated by this structure, adjusting the coupling state, degree of coupling, or the like as desired makes it possible to change characteristics outside a pass band, or in other words, the attenuation characteristics, without changing the characteristics of the pass band.

In addition, inductive coupling or capacitive coupling produced by the first inductor may change an attenuation pole frequency outside a pass band of the filter section.

According to this structure, the attenuation pole frequency is adjusted as a way of adjusting the attenuation characteristics.

In addition, the matching element may be constructed as follows. The matching element is connected in series between the first external connection terminal and the first connection terminal or connected in series between the second external connection terminal and the second connection terminal. The matching element is a shunt-connected matching element connected between a ground and a connection line connecting the first external connection terminal and the first connection terminal or connected between a ground and a connection line connecting the second external connection terminal and the second connection terminal.

These structures indicate specific connection states of the matching element. Setting these connection states as appropriate makes it possible to adjust the above-described attenuation characteristics as desired while carrying out impedance matching between the filter section and the exterior as appropriate.

In addition, the high-frequency module may include a third filter element connected at one end to a connection line aside from the connection line to which the one end of the second filter element is connected, and connected at another end to the third connection terminal.

Through this, the second inductor is connected at one end to a ground and at the other end to the second filter element and the third filter element.

In addition, a high-frequency module may have the following structure. The filter section includes a sixth connection terminal and a second filter section, and the second filter section is connected between the sixth connection terminal and a connection line connecting the first connection terminal and the first filter element, or is connected between the sixth connection terminal and a connection line connecting the second connection terminal and the first filter element.

According to this structure, a multiplexer/branching filter (a duplexer or the like) that uses the first connection terminal as a common terminal and the second connection terminal and the sixth connection terminal as individual terminals is realized.

In addition, a high-frequency module may have the following structure.

In a high-frequency module, the filter section includes an interdigital transducer electrode. The high-frequency module further includes a planar filter substrate in which the interdigital transducer (IDT) electrode is provided on a first main surface, a planar cover layer that opposes the first main surface of the filter substrate with a gap between the cover layer and the first main surface, a connection electrode having a shape that protrudes from the first main surface and passes through the cover layer, and a multilayer substrate where the first inductor is mounted or located; the filter substrate is disposed so that the first main surface side thereof faces a mounting surface of the multilayer substrate; and the filter substrate is connected to the multilayer substrate through the connection electrode.

According to this structure, the high-frequency module is realized by a filter section including a WLP (Wafer Level Package) and a multilayer substrate. This makes it possible to reduce the size of the high-frequency module.

In addition, a high-frequency module may have the following structure. A matching element includes a mounted circuit element mounted on the mounting surface of the multilayer substrate; the first inductor is mounted on the mounting surface of the multilayer substrate or located within the multilayer substrate; and the mounted circuit element and the first inductor are disposed nearby each other.

In addition, the matching element of the high-frequency module may have the following structure. The matching element includes a mounted circuit element mounted on the mounting surface of the multilayer substrate; the first inductor is provided within the cover layer; and the mounted circuit element and the first inductor are disposed nearby each other.

These structures are specific examples of a high-frequency module using a WLP in the case where the matching element is a mounted circuit element. These structures also indicate specific examples of the inductor. According to these structures, the coupling between the matching element and the inductor is realized with certainty.

It is preferable that a high-frequency module have the following structure. The matching element includes a rectangular or substantially rectangular parallelepiped housing, and a spiral conductor, provided within the housing, that has a rectangular or substantially rectangular outer circumferential shape when viewed in plan view; and the matching element is disposed so that a long side of the housing is nearby the first inductor.

According to this structure, it is easy to achieve coupling between the matching element and the inductor, and it is also easy to adjust to a desired degree of coupling.

In addition, a high-frequency module may have the following structure. In a high-frequency module, the filter section includes an interdigital transducer electrode. The high-frequency module includes a planar filter substrate in which the interdigital transducer electrode is provided on a first main surface, and a planar filter mounting substrate, disposed on the first main surface side of the filter substrate, to which the filter substrate is mounted on the first main surface side of the filter substrate; and the matching element is mounted or located on the mounting surface of the filter mounting substrate.

This structure indicates a case where the high-frequency module is realized as a CSP (Chip Size Package).

In addition, the high-frequency module may have the following structure. The matching element is a matching inductor connected in parallel to an antenna, and the matching inductor and the first inductor are provided within the multilayer substrate so as to be nearby each other.

According to this structure, the matching inductor connected in parallel to the antenna and the first inductor are nearby each other, and thus stronger inductive coupling occurs.

In addition, the matching inductor and the first inductor may have the following structure. The matching inductor and the first inductor are linear electrodes provided on mutually different layers of the multilayer substrate; the linear electrode that defines the matching inductor includes a portion that overlaps with the linear electrode that defines the first inductor when viewed in a laminating direction of the multilayer substrate; and the linear electrode that defines the matching inductor and the linear electrode that defines the first inductor have opposite high-frequency signal transmission directions in the overlapping portion.

When the matching inductor and the first inductor inductively couple in such a structure, the effective inductance values of the inductors increase. Accordingly, the lengths of the linear electrodes defining the inductors are able to be reduced, which makes it possible to reduce the size of the high-frequency module.

According to various preferred embodiments of the present invention, a high-frequency module including a small filter circuit having superior attenuation characteristics outside a pass band are realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
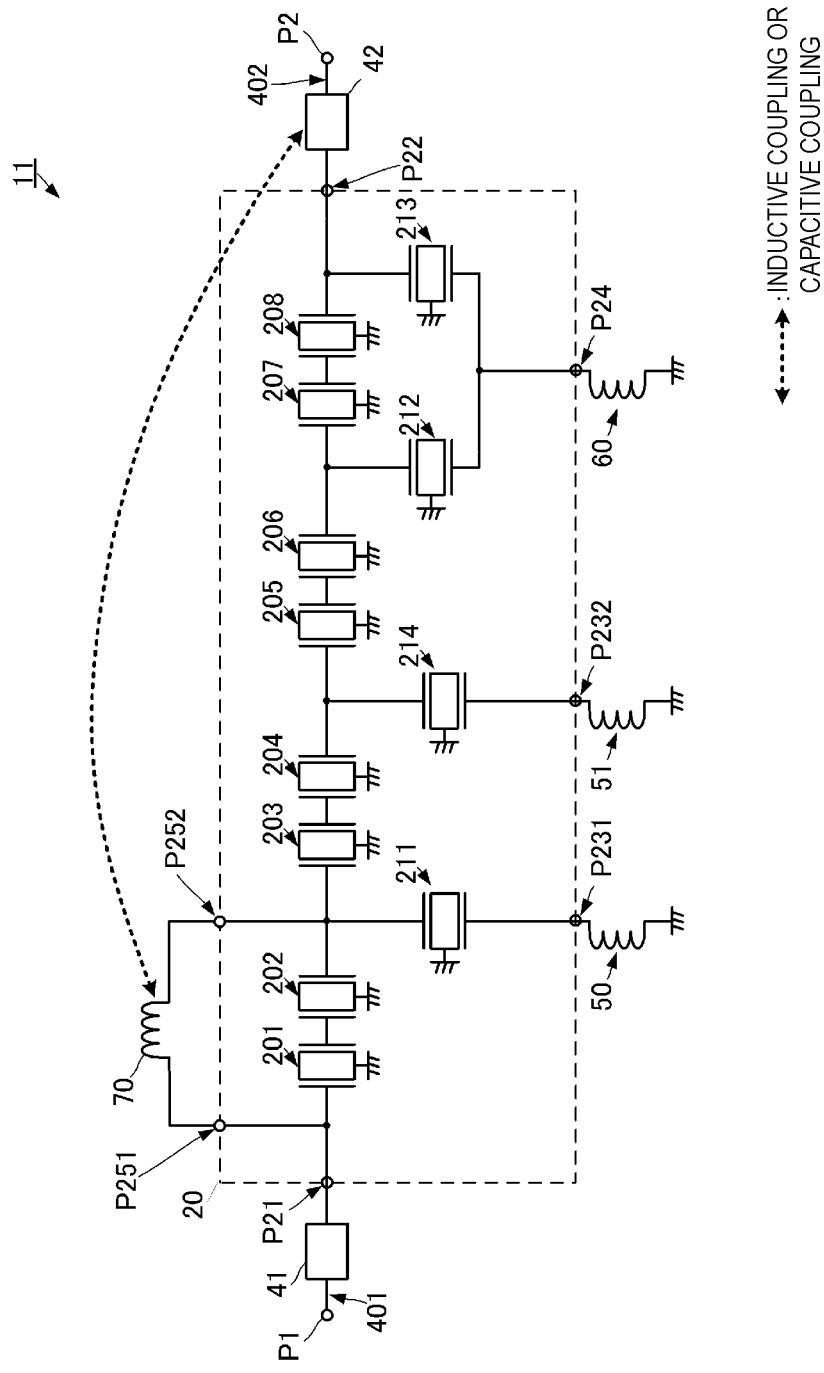
FIG. 1 is a circuit block diagram illustrating a first circuit example of a high-frequency module according to a preferred embodiment of the present invention.
Figure 2:
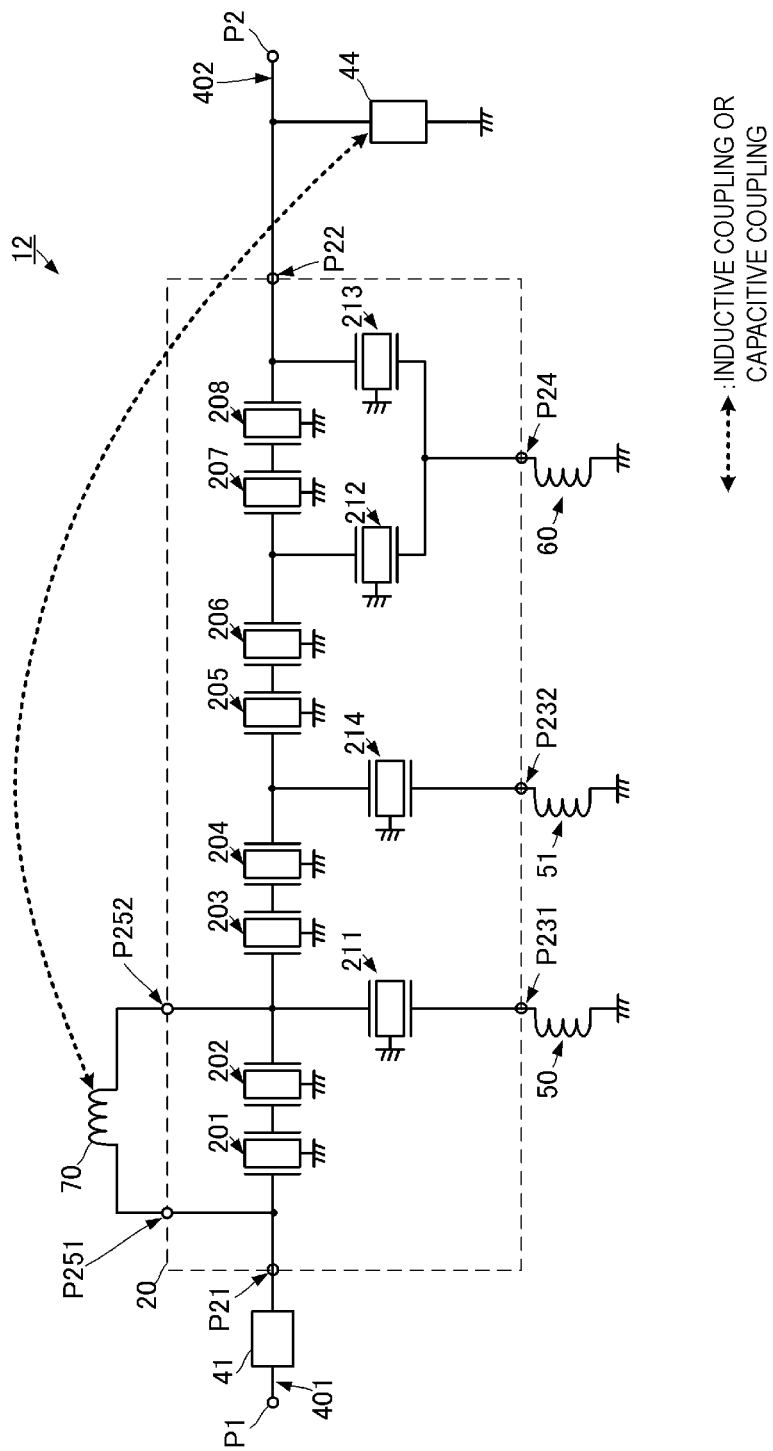
FIG. 2 is a circuit block diagram illustrating a second circuit example of a high-frequency module according to a preferred embodiment of the present invention.
Figure 3:
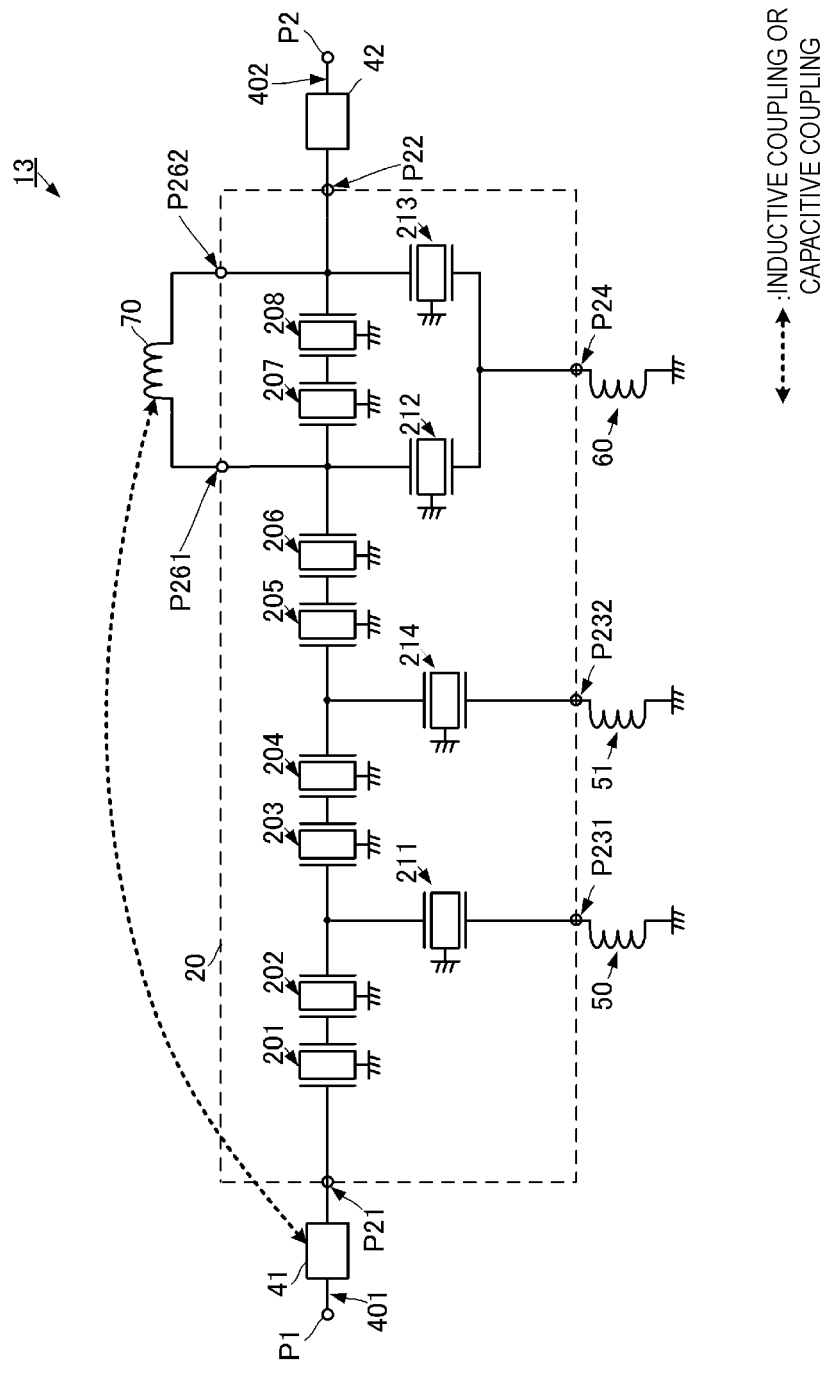
FIG. 3 is a circuit block diagram illustrating a third circuit example of a high-frequency module according to a preferred embodiment of the present invention.
Figure 4:
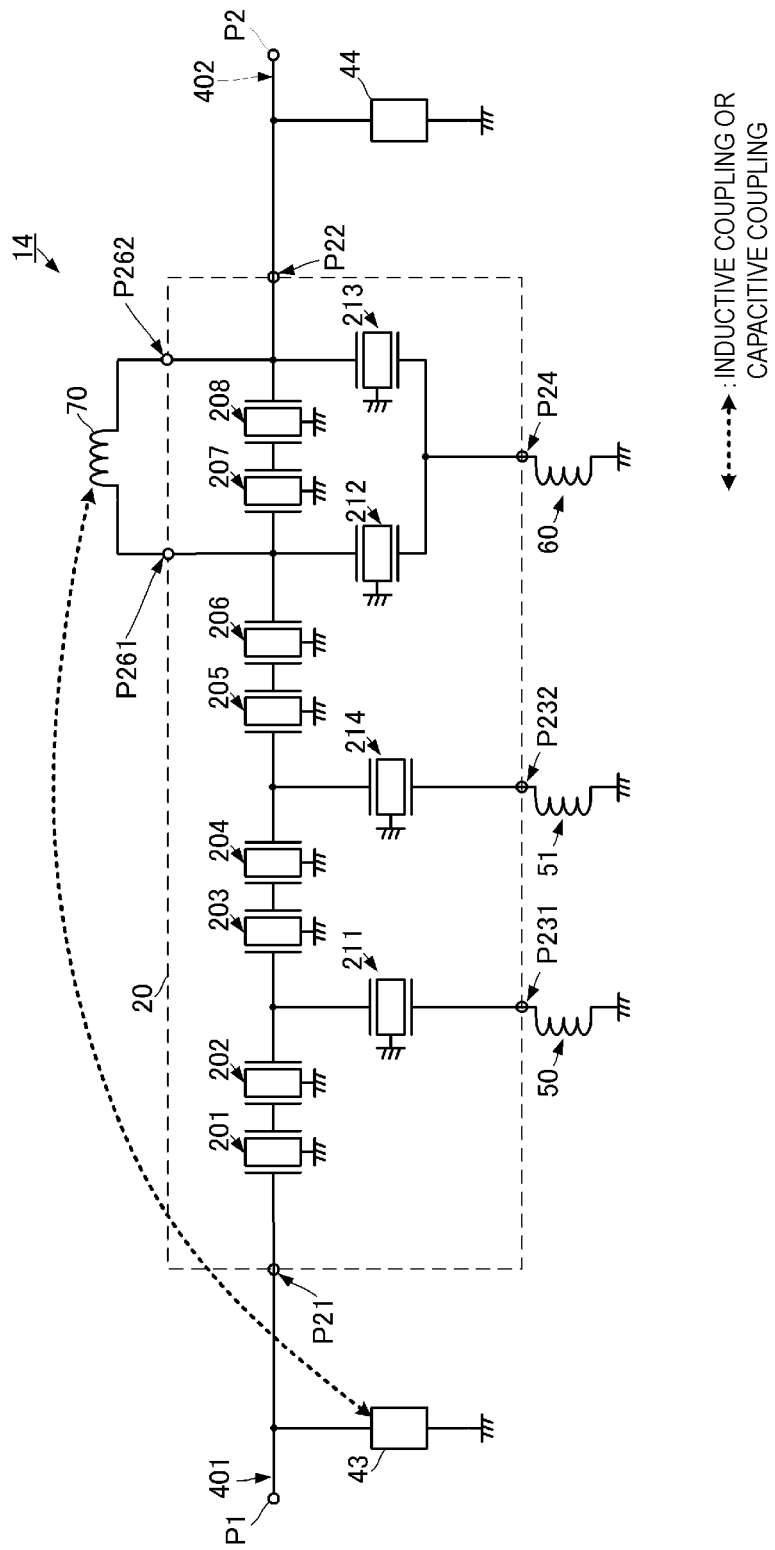
FIG. 4 is a circuit block diagram illustrating a fourth circuit example of a high-frequency module according to a preferred embodiment of the present invention.
Figure 5:
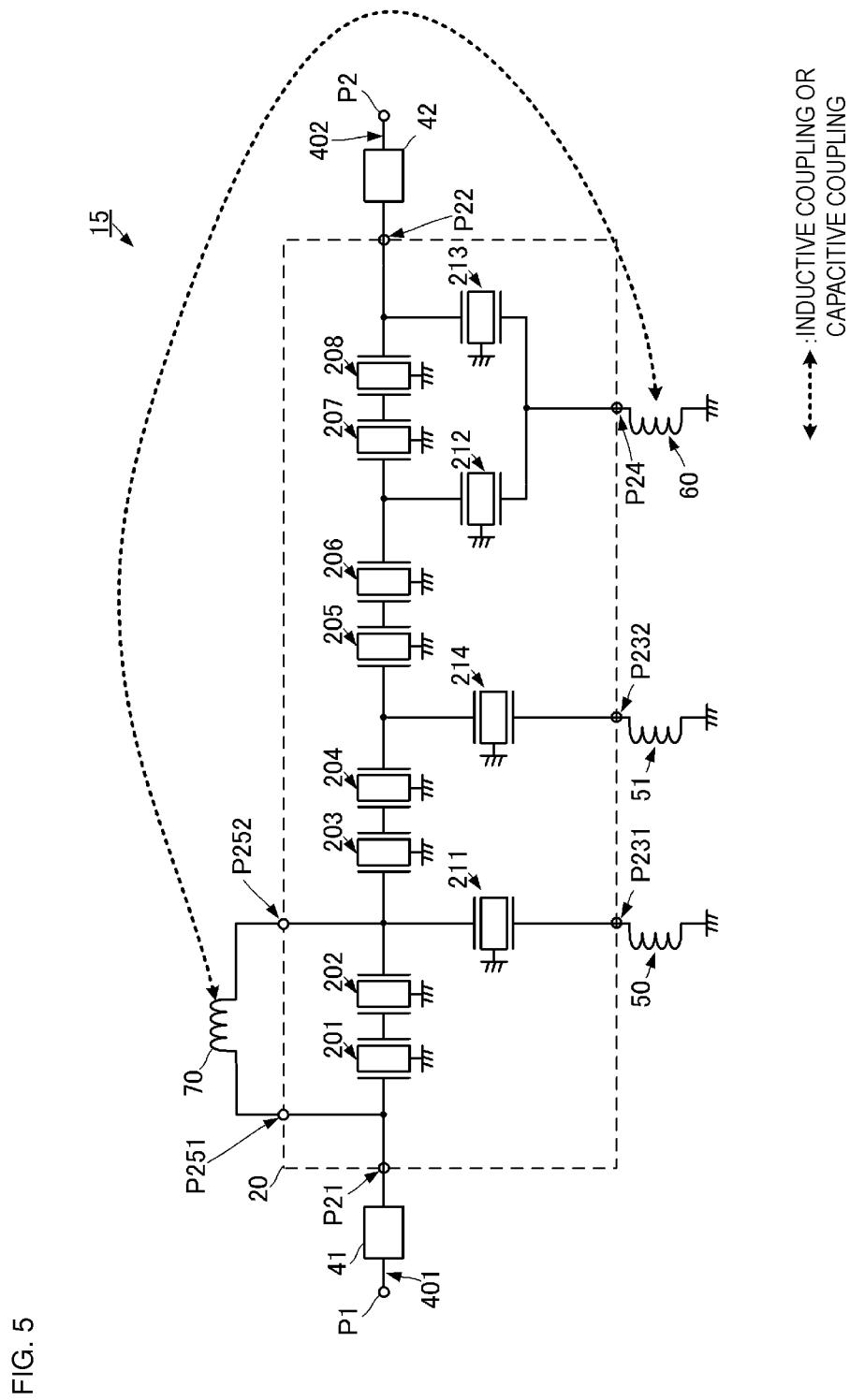
FIG. 5 is a circuit block diagram illustrating a fifth circuit example of a high-frequency module according to a preferred embodiment of the present invention.

High-frequency modules according to preferred embodiments of the present invention will be described with reference to the drawings. FIG. 1 is a circuit block diagram illustrating a first circuit example of the high-frequency module according to one of the preferred embodiments of the present invention. FIG. 2 is a circuit block diagram illustrating a second circuit example of the high-frequency module according to the present preferred embodiment of the present invention. FIG. 3 is a circuit block diagram illustrating a third circuit example of the high-frequency module according to the present preferred embodiment of the present invention. FIG. 4 is a circuit block diagram illustrating a fourth circuit example of the high-frequency module according to the present preferred embodiment of the present invention. FIG. 5 is a circuit block diagram illustrating a fifth circuit example of the high-frequency module according to the present preferred embodiment of the present invention. Note that FIGS. 1 to 5 illustrate representative examples of inductive coupling or capacitive coupling to make the diagrams easier to understand. FIGS. 6A, 6B, 6C, and 6D are circuit diagrams illustrating specific examples of matching circuits on a first external connection terminal side. FIGS. 6E, 6F, 6G, and 6H are circuit diagrams illustrating specific examples of matching circuits on a second external connection terminal side.

A circuit structure shared among high-frequency modules 11, 12, 13, 14, and 15 illustrated in FIGS. 1 to 5, respectively, will be described first.

The high-frequency modules 11, 12, 13, 14, and 15 include a first external connection terminal P1, a second external connection terminal P2, and a filter section 20. The filter section 20 is connected between the first external connection terminal P1 and the second external connection terminal P2.

The filter section 20 includes a first connection terminal P21, a second connection terminal P22, and third connection terminals P231, P232, and P24. The first connection terminal P21 is connected to the first external connection terminal P1 through a series-connected matching element or a shunt-connected matching element, described later. The second connection terminal P22 is connected to the second external connection terminal P2 through a series-connected matching element or a shunt-connected matching element, described later.

The third connection terminal P231 is grounded through an inductor 50. The third connection terminal P232 is grounded through an inductor 51. The third connection terminal P24 is grounded through an inductor 60. The third connection terminal P24 corresponds to a "third connection terminal", and the inductor 60 corresponds to a "second inductor".

The filter section 20 includes a plurality of SAW resonators 201, 202, 203, 204, 205, 206, 207, and 208 (the plurality of SAW resonators will be referred to collectively simply as a plurality of SAW resonators 201-208 hereinafter). These SAW resonators correspond to a "first filter element". The filter section 20 also includes a plurality of SAW resonators 211, 212, 213, and 214. One of the SAW resonator 212 and the SAW resonator 213 corresponds to a "second filter element", and the other corresponds to a "third filter element".

Each of the plurality of SAW resonators 201-208, 211, 212, 213, and 214 has a resonant frequency, and functions as a band pass filter (BPF) having individual band pass characteristics. The plurality of SAW resonators 201-208 are connected in series between the first connection terminal P21 and the second connection terminal P22 with a plurality of connection lines.

The SAW resonator 211 is connected between the third connection terminal P231 and the connection line that connects the SAW resonators 202 and 203. The SAW resonator 214 is connected between the third connection terminal P232 and the connection line that connects the SAW resonators 204 and 205.

The SAW resonator 212 is connected between the third connection terminal P24 and the connection line that connects the SAW resonator 206 and the SAW resonator 207. The SAW resonator 213 is connected between the third connection terminal P24 and the connection line that connects the SAW resonator 208 and the second connection terminal P22. In other words, the third connection terminal P24 is a common terminal for the SAW resonators 212 and 213, and collectively grounds one end of the SAW resonators 212 and 213.

Through this structure, the filter section 20 constitutes what is known as a ladder connection filter, and desired band pass characteristics and attenuation characteristics outside a pass band are realized in the filter section 20 by combining the band pass characteristics and the attenuation characteristics of the SAW resonators 201-208, 211, 212, 213, and 214. Note that the number and locations of the SAW resonators may be changed as appropriate in order to achieve the frequency bands of signals allowed to pass and the desired attenuation characteristics outside the pass band.

A matching element 41 or a matching element 43 is connected between the first connection terminal P21 and the first external connection terminal P1 in order to achieve impedance matching between a circuit connected on the first external connection terminal P1 side and the filter section 20.

A matching element 42 or a matching element 44 is connected between the second connection terminal P22 and the second external connection terminal P2 in order to achieve impedance matching between a circuit connected on the second external connection terminal P2 side and the filter section 20.

However, it is not necessary that the high-frequency modules 11, 12, 13, 14, and 15 include matching elements on both the first external connection terminal P1 side and the second external connection terminal P2 side, and may instead include only one matching element on either the first external connection terminal P1 side or the second external connection terminal P2 side.

Figure 6A:
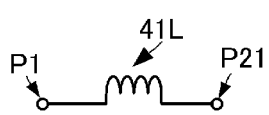
FIGS. 6A-6H are circuit diagrams illustrating specific examples of matching elements in the high-frequency modules illustrated in FIGS. 1 to 5.
Figure 6E:
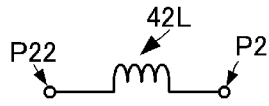
Figure 6B:
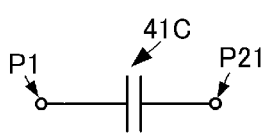
Figure 6F:
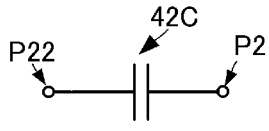
Figure 6C:
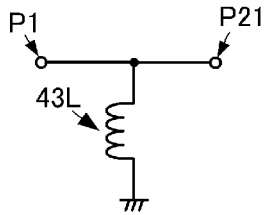
Figure 6G:
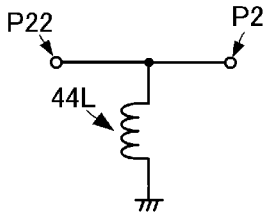
Figure 6D:
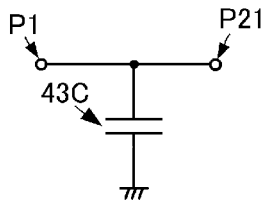
Figure 6H:
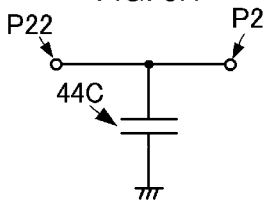

As illustrated in FIGS. 6A and 6B, the matching element 41 is, for example, a series-connected inductor 41L or capacitor 41C. As illustrated in FIGS. 6C and 6D, the matching element 43 is, for example, a shunt-connected inductor 43L or capacitor 43C. As illustrated in FIGS. 6E and 6F, the matching element 42 is, for example, a series-connected inductor 42L or capacitor 42C. As illustrated in FIGS. 6G and 6H, the matching element 44 is, for example, a shunt-connected inductor 44L or capacitor 44C.

The high-frequency module 11 according to the first circuit example, the high-frequency module 13 according to the third circuit example, and the high-frequency module 15 according to the fifth circuit example include the series-connected matching element 41 and the series-connected matching element 42. The high-frequency module 12 according to the second circuit example includes the series-connected matching element 41 and the shunt-connected matching element 44. The high-frequency module 14 according to the fourth circuit example includes the shunt-connected matching element 43 and the shunt-connected matching element 44.

In addition to this shared circuit structure of the high-frequency modules 11, 12, 13, 14, and 15, the individual high-frequency modules have the following specific circuit structures.

First Circuit Example

In the high-frequency module 11 illustrated in FIG. 1, the filter section 20 includes a fourth connection terminal P251 connected to a connection line between the first connection terminal P21 and the SAW resonator 201, and a fifth connection terminal P252 connected to a connection line between the SAW resonator 202 and the SAW resonator 203.

The high-frequency module 11 includes an inductor 70, external to the filter section 20, that is connected at one end to the fourth connection terminal P251 and connected at another end to the fifth connection terminal P252. In other words, the inductor 70 is connected in parallel to a series circuit constituted of the SAW resonator 201 and the SAW resonator 202 through the fourth connection terminal P251 and the fifth connection terminal P252. The inductor 70 corresponds to a "first inductor".

In the high-frequency module 11 according to the first circuit example, when a high-frequency signal propagates from the first external connection terminal P1 or the second external connection terminal P2 and the high-frequency signal propagates to the inductor 70 and the matching element 42, inductive coupling or capacitive coupling occurs between the inductor 70 and the matching element 42. To be more specific, if the matching element 42 is the inductor 42L, inductive coupling occurs between the inductor and the inductor 42L. If the matching element 42 is the capacitor 42C, capacitive coupling occurs between the conductor that defines the inductor 70 and the capacitor 42C. Hereinafter, a circuit that contains an inductive coupling or capacitive coupling path between the inductor 70 and the matching element 42 will be called a coupling circuit, and it is assumed that the coupling circuit includes the inductor 70 and the matching element 42.

The high-frequency signal propagating from the first external connection terminal P1 or the second external connection terminal P2 propagates not only along a main transmission path formed by the SAW resonators 201-208 and the inductor 70 connected directly, but also partially propagates along a sub transmission path that uses the coupling circuit as a transmission path.

Through this, the high-frequency module 11 has combined transmission characteristics obtained by combining transmission characteristics of the main transmission path and transmission characteristics of the sub transmission path.

Here, the amplitude and phase of the high-frequency signal propagating in the sub transmission path are able to be adjusted by adjusting the coupling state and degree of coupling between the matching element 42 and the inductor 70 in the coupling circuit. To rephrase, the transmission characteristics of the sub transmission path are able to be adjusted. The transmission characteristics are, for example, attenuation characteristics (amplitude characteristics), phase characteristics, and the like.

Furthermore, by adjusting the coupling state and the degree of coupling, the effect of establishing the sub transmission path is able to be imparted on the attenuation characteristics outside the pass band only, almost without any effect on the transmission characteristics of the frequency band of the high-frequency signal which the high-frequency module 11 is to allow to pass (the desired high-frequency signal).

The transmission characteristics of the high-frequency module 11 are able to be adjusted by adjusting the transmission characteristics of the sub transmission path in this manner. For example, the attenuation characteristics outside the pass band are able to be adjusted, as will be described later.

At this time, it is not necessary to provide a separate inductor, capacitor, or the like just to adjust the transmission characteristics of a high-frequency filter circuit as with conventional structures, and it is of course not necessary to connect such an inductor, capacitor, or the like in parallel to the circuit constituted by the SAW filter group. The high-frequency module 11 is therefore able to achieve the desired attenuation characteristics with a simple structure. This makes it possible to provide the high-frequency module 11 with a small size.

In addition, in the case where the matching element 42 is the inductor 42L, mutual induction arising due to the above-described coupling circuit makes it possible to increase effective inductance values of the inductor 42L and the inductor 70. Accordingly, the line length of the inductor 42L and the inductor 70 is able to be shortened and the high-frequency module 11 is able to be further reduced in size.

Second Circuit Example

Next, the high-frequency module 12 according to the second circuit example illustrated in FIG. 2 will be described.

The high-frequency module 12 differs from the high-frequency module 11 according to the first circuit example illustrated in FIG. 1 in that the structure of the above-described coupling circuit is different.

To be more specific, the high-frequency module 12 differs from the high-frequency module 11 in that the high-frequency module 12 includes the shunt-connected matching element 44 instead of the series-connected matching element 42, and in that a coupling circuit is defined by inductive coupling or capacitive coupling between the inductor 70 and the matching element 44.

In the high-frequency module 12, the high-frequency signal partially propagates in the sub transmission path that uses the coupling circuit as a transmission path. As such, like the above-described high-frequency module 11, the high-frequency module 12 achieves the desired attenuation characteristics with a simpler structure than conventional structures.

Third Circuit Example

Next, the high-frequency module 13 according to the third circuit example illustrated in FIG. 3 will be described.

The high-frequency module 13 differs from the high-frequency module 11 according to the first circuit example illustrated in FIG. 1 in that the connection state of the inductor 70 and the structure of the above-described coupling circuit are different.

In the high-frequency module 13, the filter section 20 includes a fourth connection terminal P261 connected to a connection line between the SAW resonator 206 and the SAW resonator 207, and a fifth connection terminal P262 connected to a connection line between the SAW resonator 208 and the second connection terminal P22.

The inductor 70 is connected in parallel to a series circuit including the SAW resonator 207 and the SAW resonator 208 through the fourth connection terminal P261 and the fifth connection terminal P262.

In the high-frequency module 13 according to the third circuit example, a coupling circuit is defined by inductive coupling or capacitive coupling between the inductor 70 and the matching element 41. In the high-frequency module 13, the high-frequency signal partially propagates in the sub transmission path that uses the coupling circuit as a transmission path. As such, like the above-described high-frequency module 11, the high-frequency module 13 achieves the desired attenuation characteristics with a simpler structure than conventional structures.

Fourth Circuit Example

Next, the high-frequency module 14 according to the fourth circuit example illustrated in FIG. 4 will be described.

The high-frequency module 14 differs from the high-frequency module 13 according to the third circuit example illustrated in FIG. 3 in that the structure of the above-described coupling circuit is different.

To be more specific, the high-frequency module 14 differs from the high-frequency module 13 according to the third circuit example illustrated in FIG. 3 in that the high-frequency module 14 includes the shunt-connected matching element 43 instead of the series-connected matching element 41, and in that a coupling circuit is defined by inductive coupling or capacitive coupling between the inductor 70 and the matching element 43.

In the high-frequency module 14, the high-frequency signal partially propagates in the sub transmission path that uses the coupling circuit as a transmission path. As such, like the above-described high-frequency module 13, the high-frequency module 14 achieves the desired attenuation characteristics with a simpler structure than conventional structures.

In the above-described first to fourth circuit examples, the SAW resonators to which the inductor 70 is connected in parallel are the series circuit of the SAW resonator 201 and the SAW resonator 202 or the series circuit of the SAW resonator 207 and the SAW resonator 208. However, the inductor 70 may be connected to any SAW resonators aside from the SAW resonators directly connected to the matching element that defines the coupling circuit.

For example, in the first circuit example and the second circuit example, the inductor 70 is not limited to being connected to the series circuit of the SAW resonator 201 and the SAW resonator 202, and may be connected in parallel to one of the SAW resonators 201, 202, 203, 204, 205, 206, and 207, aside from the SAW resonator 208. Likewise, in the first circuit example and the second circuit example, the inductor 70 may be connected in parallel to a series circuit including adjacent SAW resonators among the SAW resonators 201, 202, 203, 204, 205, 206, and 207, aside from the SAW resonator 208.

In addition, in the third circuit example and the fourth circuit example, the inductor 70 is not limited to being connected to the series circuit of the SAW resonator 207 and the SAW resonator 208, and may be connected in parallel to one of the SAW resonators 202, 203, 204, 205, 206, 207, and 208, aside from the SAW resonator 201. Likewise, in the third circuit example and the fourth circuit example, the inductor 70 may be connected in parallel to a series circuit including adjacent SAW resonators among the SAW resonators 202, 203, 204, 205, 206, 207, and 208, aside from the SAW resonator 201.

Fifth Circuit Example

Next, the high-frequency module 15 according to the fifth circuit example illustrated in FIG. 5 will be described.

The high-frequency module 15 differs from the high-frequency module 11 according to the first circuit example illustrated in FIG. 1 in that the structure of the coupling circuit is different.

To be more specific, the high-frequency module 15 forms the coupling circuit through inductive coupling between the inductor 70 and the inductor 60.

In the high-frequency module 15, the high-frequency signal partially propagates in the sub transmission path that uses the coupling circuit as a transmission path. As such, like the above-described high-frequency module 11, the high-frequency module 15 achieves the desired attenuation characteristics with a simpler structure than conventional structures.

However, in the fifth circuit example, the coupling circuit may be defined by inductive coupling between the inductor 70 and the inductor 50, or may be defined by inductive coupling between the inductor 70 and the inductor 51. In the case where the coupling circuit is defined by inductive coupling between the inductor 70 and the inductor 50, the SAW resonator 211 corresponds to the "second filter element". In the case where the coupling circuit is defined by inductive coupling between the inductor 70 and the inductor 51, the SAW resonator 214 corresponds to the "second filter element".

Meanwhile, although the inductor 70 is provided outside of the filter section 20 in the first to fifth circuit examples, the inductor 70 may be provided within the filter section 20.

Figure 7:
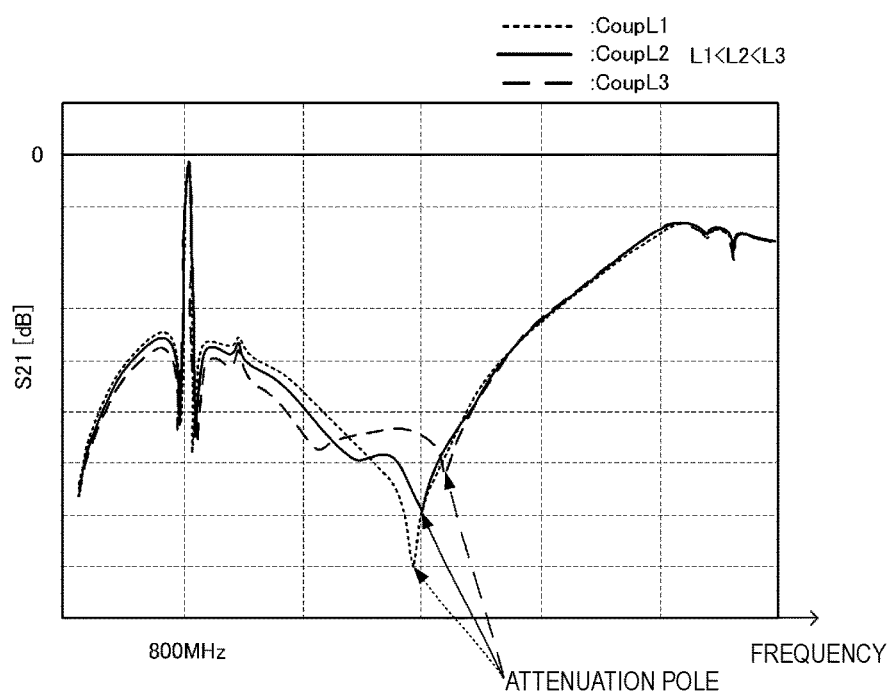
FIG. 7 is a graph illustrating changes in bandpass characteristics of a high-frequency module when a degree of inductive coupling between a matching element and an inductor is changed.

Next, effects of the high-frequency modules 11, 12, 13, 14, and 15 will be described. FIG. 7 is a graph illustrating changes in bandpass characteristics of a high-frequency module when a degree of inductive coupling between a matching element and the inductor 70 is changed. The horizontal axis in FIG. 7 represents a frequency, and the vertical axis in FIG. 7 represents attenuation in the signal propagating from the first external connection terminal P1 to the second external connection terminal P2. Characteristics indicated by the dotted line in FIG. 7 indicate a case of low inductive coupling between the matching element and the inductor 70. Characteristics indicated by the solid line in FIG. 7 indicate stronger inductive coupling than the characteristics indicated by the dotted line. Characteristics indicated by the broken line in FIG. 7 indicate stronger inductive coupling than the characteristics indicated by the solid line. Note that the high-frequency modules according to the present preferred embodiment preferably are band pass filters that take an 800 MHz band as a pass band, for example.

As illustrated in FIG. 7, the frequency at which an attenuation pole appears on a high-frequency side relative to the pass band is higher the stronger the inductive coupling becomes. Note that the attenuation pole is an attenuation peak, and the frequency of the attenuation pole is a frequency at which the attenuation peaks.

Meanwhile, in the case where the matching element is an inductor, the attenuation characteristics on the high-frequency side relative to the pass band are able to be changed by setting the inductive coupling as desired. For example, as the inductive coupling weakens, the attenuation in the vicinity of the pass band is smaller, but a greater attenuation is able to be achieved at the frequency of the attenuation pole. In addition, as the inductive coupling strengthens, a greater attenuation is able to be achieved in the vicinity of the pass band.

Furthermore, as illustrated in FIG. 7, the position of a center frequency of the pass band, a width of the frequency of the pass band, and the attenuation at the center frequency of the pass band undergo almost no change regardless of the strength of the inductive coupling.

Accordingly, by using the structure of the present preferred embodiment and adjusting the degree of inductive coupling as desired, the attenuation characteristics on the high-frequency side relative to the pass band are able to be adjusted to desired characteristics without changing the characteristics of the pass band. Put differently, a high-frequency module having desired pass band characteristics and attenuation characteristics is realized.

Although not illustrated, in the case where the matching element is a capacitor, the frequency of the attenuation pole appearing on the high-frequency side relative to the pass band decreases as the capacitive coupling between the conductor that defines the inductor 70 and the capacitor strengthens. Furthermore, the position of the center frequency of the pass band, the width of the frequency of the pass band, and the attenuation at the center frequency of the pass band undergo almost no change regardless of the strength of the capacitive coupling. Accordingly, by using the structure of the present preferred embodiment and adjusting the degree of capacitive coupling as desired, the attenuation characteristics on the high-frequency side are able to be adjusted to desired characteristics without changing the characteristics of the pass band.

Figure 8:
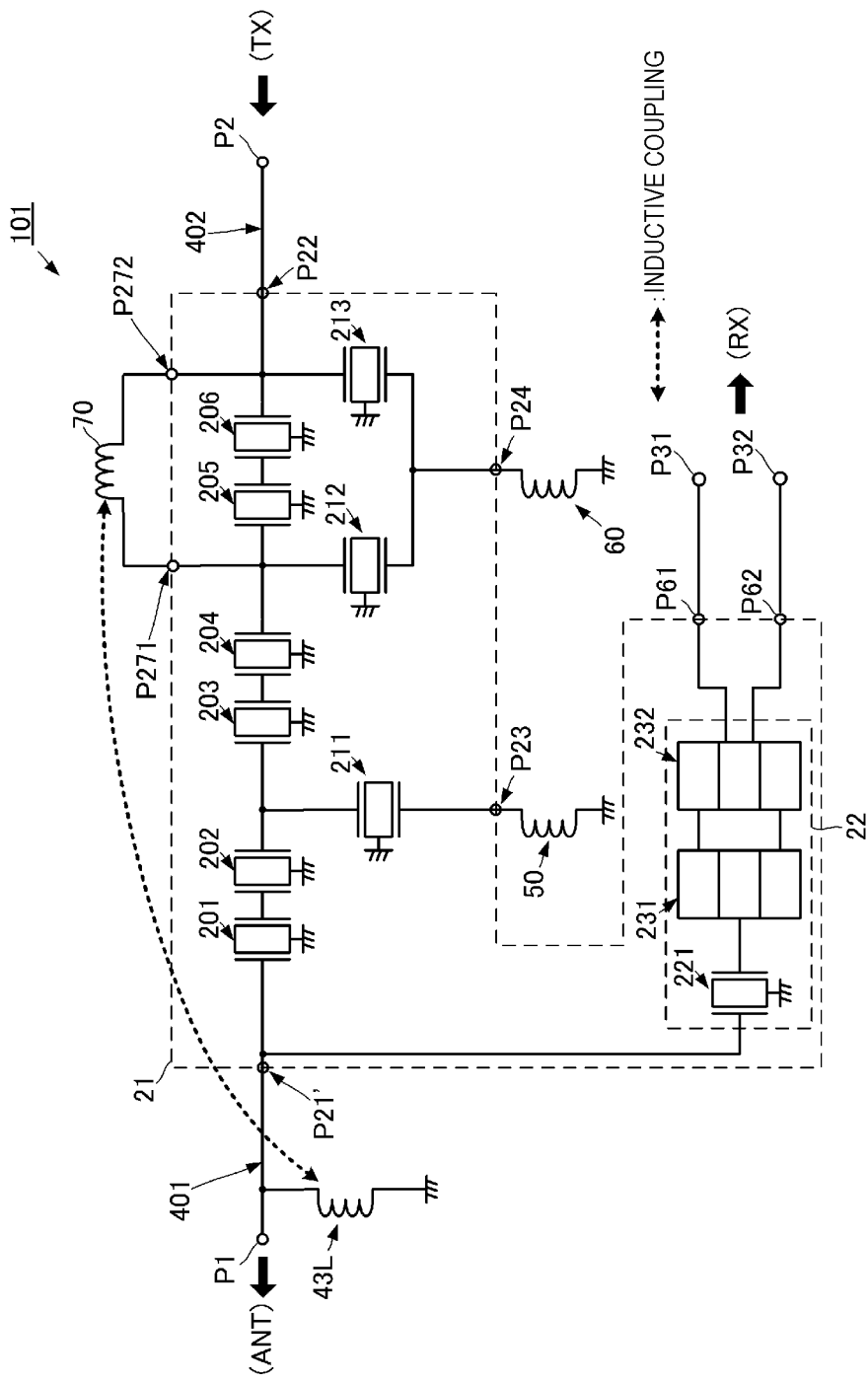
FIG. 8 is an equivalent circuit diagram illustrating a high-frequency module having a duplexer structure.

Specific examples of applications of the high-frequency module configured in this manner can be used in a duplexer structure, as illustrated in FIG. 8. FIG. 8 is an equivalent circuit diagram illustrating a high-frequency module with a duplexer structure.

A high-frequency module 101 includes a filter section 21, the first external connection terminal P1, the second external connection terminal P2, and third external connection terminals P31 and P32. As an example of a specific application, the first external connection terminal P1 is connected to an antenna. The second external connection terminal P2 is connected to a transmission circuit Tx. The third external connection terminals P31 and P32 are connected to a reception circuit Rx.

The filter section 21 includes a first connection terminal P21', the second connection terminal P22, a third connection terminal P23, the third connection terminal P24, a fourth connection terminal P271, a fifth connection terminal P272, and sixth connection terminals P61 and P62.

The sixth connection terminals P61 and P62 are connected to the third external connection terminals P31 and P32. The first connection terminal P21' is connected to the first external connection terminal P1 through a connection line 401. The inductor 43L, which corresponds to the above-described matching element, is connected between the connection line 401 and a ground. In other words, the inductor 43L provides impedance matching between the filter section 21 and the antenna connected to the first external connection terminal P1. The second connection terminal P22 is connected to the second external connection terminal P2 through a connection line 402.

The plurality of SAW resonators 201, 202, 203, 204, 205, and 206 are connected in series between the first connection terminal P21' and the second connection terminal P22 with a plurality of connection lines.

The connection line that connects the SAW resonator 202 and the SAW resonator 203 is connected to the third connection terminal P23 through the SAW resonator 211. The third connection terminal P23 is grounded through the inductor 50.

The connection line that connects the SAW resonator 204 and the SAW resonator 205 is connected to the third connection terminal P24 through the SAW resonator 212. The connection line that connects the SAW resonator 206 and the second connection terminal P22 is connected to the third connection terminal P24 through the SAW resonator 213. The third connection terminal P24 is grounded through the inductor 60.

The connection line that connects the SAW resonator 204 and the SAW resonator 205 is connected to the fourth connection terminal P271. The connection line that connects the SAW resonator 206 and the second connection terminal P22 is connected to the fifth connection terminal P272. The inductor 70 is connected to the fourth connection terminal P271 at one end and to the fifth connection terminal P272 at another end. Accordingly, the inductor 70 is connected in parallel to a series circuit constituted of the SAW resonator 205 and the SAW resonator 206 through the fourth connection terminal P271 and the fifth connection terminal P272.

According to this structure, by combining the band pass characteristics and the attenuation characteristics of the SAW resonators 201-206, 211, 212, and 213 between the first connection terminal P21' and the second connection terminal P22 in the filter section 21, desired first band pass characteristics and first attenuation characteristics outside a first pass band are achieved between the first connection terminal P21' and the second connection terminal P22 of the filter section 21.

A SAW resonator 221 and longitudinally coupled SAW resonators 231 and 232 are connected in series between the first connection terminal P21' and the sixth connection terminals P61 and P62. The SAW resonator 221 and the longitudinally coupled SAW resonators 231 and 232 define a second filter section 22. According to this structure, by combining the band pass characteristics and the attenuation characteristics of the SAW resonators 221, 231, and 232 between the first connection terminal P21' and the sixth connection terminals P61 and P62 in the filter section 21, desired second band pass characteristics and second attenuation characteristics outside a second pass band are achieved between the first connection terminal P21' and the sixth connection terminals P61 and P62 of the filter section 21. The second pass band is a different frequency band from the first pass band, and the second pass band is set to be within an attenuation band range outside the first pass band.

Accordingly, the filter section 21 defines and functions as a duplexer that takes the first connection terminal P21' as a common terminal and the second connection terminal P22 and sixth connection terminals P61 and P62 are respective individual terminals.

Furthermore, in the high-frequency module 101, inductive coupling occurs between the inductor 70 and the inductor 43L. The first attenuation characteristics are able to be adjusted by adjusting the degree of this coupling.

Here, using the structure of the present preferred embodiment, a band width and attenuation of a frequency band in which large attenuation in the first attenuation characteristics are able to be obtained are able to be adjusted so as to overlap with the second pass band. This is possible by adjusting the degree of coupling between the inductor 70 and the inductor 43L.

Figure 9:
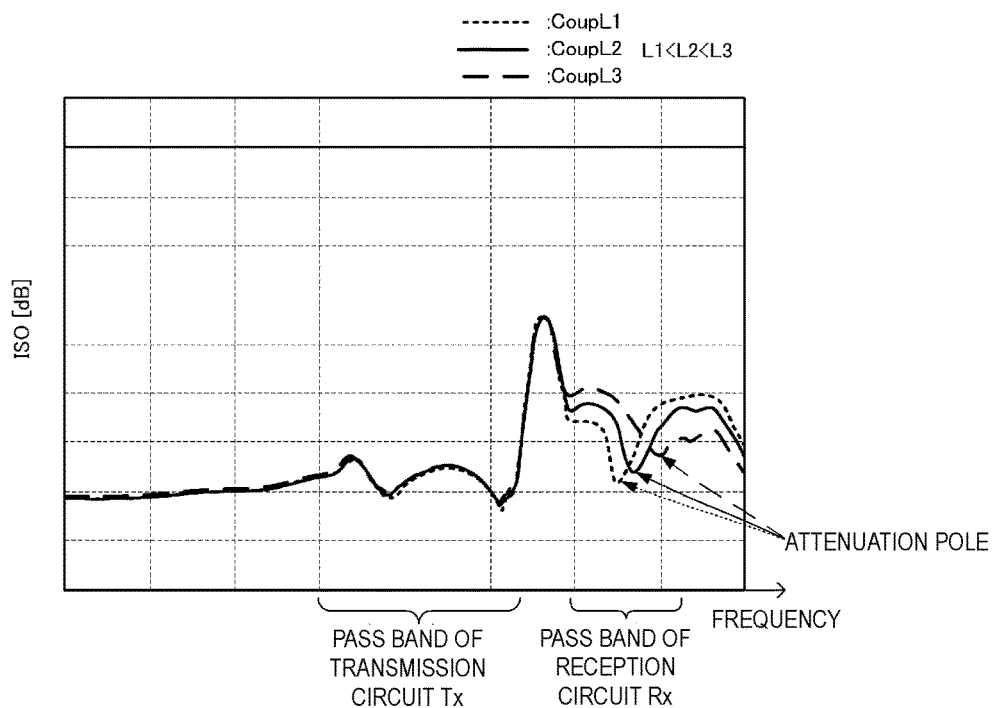
FIG. 9 is a graph illustrating a change in isolation between a second external connection terminal and a third external connection terminal of a high-frequency module when a degree of inductive coupling between a matching circuit and an inductor is changed.

FIG. 9 is a graph illustrating a change in isolation between the second external connection terminal P2 and the third external connection terminals P31 and P32 of the high-frequency module when the degree of inductive coupling between the matching element and the inductor 70 is changed. The horizontal axis in FIG. 9 represents a frequency, and the vertical axis in FIG. 9 represents an isolation amount. FIG. 9 indicates that the second connection terminal P22 and the sixth connection terminals P61 and P62 are more strongly isolated as the isolation amount decreases. Characteristics indicated by the dotted line in FIG. 9 indicate weak inductive coupling. Characteristics indicated by the solid line in FIG. 9 indicate stronger inductive coupling than the characteristics indicated by the dotted line. Characteristics indicated by the broken line in FIG. 9 indicate stronger inductive coupling than the characteristics indicated by the solid line.

As illustrated in FIG. 9, the frequency of the attenuation pole appearing near the pass band of the reception circuit Rx (on the side of the sixth connection terminals P61 and P62) increases as the inductive coupling strengthens. Accordingly, the isolation amount and isolation characteristics of the pass band of the reception circuit Rx are able to be adjusted by adjusting the inductive coupling. Meanwhile, as illustrated in FIG. 9, the isolation amount and isolation characteristics of the pass band of the transmission circuit Tx (on the second external connection terminal P2 side) undergo almost no change even if the inductive coupling is adjusted.

In this manner, the isolation characteristics between the second connection terminal P22 and the sixth connection terminals P61 and P62 are able to be adjusted as desired by using the structure of the high-frequency module 101. In other words, isolation characteristics between the transmission circuit Tx and the reception circuit Rx are able to be optimized.

Although not illustrated, in the case where the capacitor 43C is used as the matching element instead of the inductor 43L and the capacitor 43C and the conductor that defines the inductor 70 are caused to couple capacitively, the frequency of the attenuation pole appearing near the pass band of the reception circuit Rx decreases as the capacitive coupling strengthens. Accordingly, the isolation amount and isolation characteristics of the pass band of the reception circuit Rx (the side of the sixth connection terminals P61 and P62) are able to be adjusted by adjusting the capacitive coupling. Meanwhile, the isolation amount and isolation characteristics of the pass band of the transmission circuit Tx undergo almost no change even if the capacitive coupling is adjusted. In this manner, the isolation characteristics between the second connection terminal P22 and the sixth connection terminals P61 and P62 are able to be adjusted as desired by adjusting the capacitive coupling as appropriate.

A high-frequency module as described above is realized through structures such as those described hereinafter. The following describes examples of structural implementations of the high-frequency module 101 having the above-described duplexer structure.

First Structure

Figure 10:
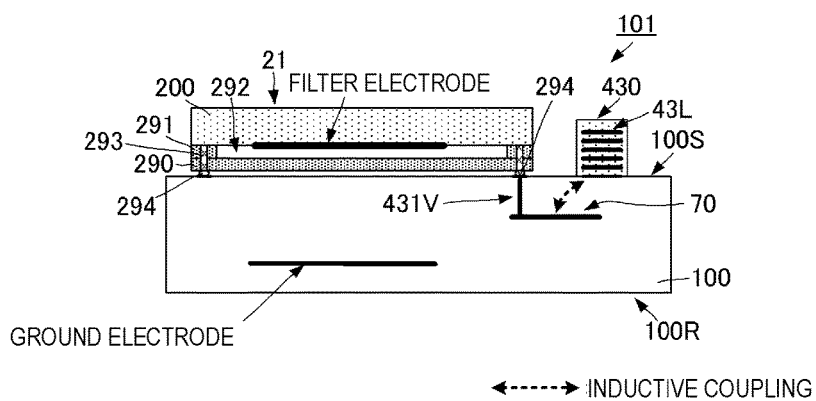
FIG. 10 is a conceptual diagram illustrating the primary structure in a first structure of a high-frequency module from the side.

FIG. 10 is a conceptual diagram illustrating the primary structure of a high-frequency module from the side. The high-frequency module 101 includes a multilayer substrate 100, a filter substrate 200, a cover layer 290, a side surface cover layer 291, and a mounted circuit element 430.

The multilayer substrate 100 preferably is formed by laminating a plurality of dielectric layers. On a top surface (mounting surface) 100S and on inner layers of the multilayer substrate 100, a predetermined electrode pattern, the inductor 70, wiring patterns excluding the filter section 21 of the high-frequency module 101, and so on are formed.

The inductor 70 is formed of a partially-segmented tubular linear electrode (linear conductor). One end of the linear electrode is connected, through a via conductor 431V, to a land electrode on which a mounting electrode 294 that defines and functions as the fourth connection terminal P271 of the filter section 21 is mounted. The land electrode is formed on the top surface 100S of the multilayer substrate 100. Another end of the linear electrode that defines the inductor 70 is connected, through a via conductor (not shown), to a land electrode on which the mounting electrode 294 that defines and functions as the fifth connection terminal P272 of the filter section 21 is mounted.

External connection electrodes (not shown) are formed on a bottom surface 100R of the multilayer substrate 100, and the first external connection terminal P1, second external connection terminal P2, and third external connection terminals P31 and P32 are realized by these external connection electrodes.

The filter section 21 includes the filter substrate 200, the cover layer 290, the side surface cover layer 291, a connection electrode 293, and the mounting electrode 294.

The filter substrate 200 preferably is a planar piezoelectric substrate. Filter electrodes, a wiring pattern, and the like are formed on a first main surface of the filter substrate 200. The filter electrodes are formed of, for example, what are known as interdigital transducer electrodes. The SAW resonators can be realized by forming the interdigital transducer electrodes on a main surface of the piezoelectric substrate in this manner. The planar cover layer 290 is disposed on the first main surface side of the filter substrate 200. The cover layer 290 is formed from a planar insulative material, and has the same shape as the filter substrate 200 when viewed in plan view. In addition, the cover layer 290 is disposed so as to overlap the filter substrate 200 when viewed in plan view, with a gap of a predetermined distance provided between the cover layer 290 and the first main surface of the filter substrate 200.

The side surface cover layer 291 is disposed between the first main surface of the filter substrate 200 and the cover layer 290. The side surface cover layer 291 is also formed from an insulative material, and is formed around the entire periphery of the filter substrate 200 and the cover layer 290, only in a range having a predetermined width spanning from an outer edge toward the inside. In other words, the side surface cover layer 291 has a frame-shaped structure with an opening in the center thereof.

By disposing the cover layer 290 and the side surface cover layer 291 in this manner, a region in which the filter electrodes are formed on the first main surface of the filter substrate 200 is provided within a sealed space 292 defined by the filter substrate 200, the cover layer 290, and the side surface cover layer 291. This makes it possible to improve the resonance characteristics of the SAW resonators and accurately realize desired characteristics as a filter.

The connection electrode 293 is shaped so that one end thereof makes contact with the first main surface of the filter substrate 200 and another end thereof is exposed on a surface of the cover layer 290 on the side thereof opposite from the side that faces the filter substrate 200. Here, the connection electrode 293 extends through the side surface cover layer 291 and the cover layer 290. One end of the connection electrode 293 is connected to the wiring pattern provided on the first main surface of the filter substrate 200.

The mounting electrode 294 is connected to the other end of the connection electrode 293, and protrudes from the surface of the cover layer 290 on the side thereof opposite from the side that faces the filter substrate 200. The first connection terminal P21', the second connection terminal P22, the third connection terminals P23 and P24, the fourth connection terminal P271, the fifth connection terminal P272, and the sixth connection terminals P61 and P62 of the above-described filter section 21 are realized by providing a plurality of sets of the connection electrode 293 and the mounting electrode 294. Note that a bump may be provided on the other end of the connection electrode 293 using solder, Au, or the like, and the connection electrode 293 may be connected to the mounting electrode 294 by that bump.

Configuring the filter section 21 as described above provides the filter section 21 with what is known as a WLP (Wafer Level Package) structure, and makes it possible to provide the filter section 21 with a small size.

The filter section 21 having this WLP structure is then mounted on the top surface 100S of the multilayer substrate 100. As a result, the filter section 21 is connected to the first external connection terminal P1, the second external connection terminal P2, and the third external connection terminals P31 and P32.

The inductor 43L is realized by the mounted circuit element 430. Specifically, the mounted circuit element 430 includes a rectangular or substantially rectangular parallelepiped housing formed from an insulative material, and a spiral electrode serving as the inductor 43L is formed within that housing. The spiral electrode is realized by partially-segmented tubular linear electrodes extending along an outer circumference of the housing and interlayer connection electrodes. The linear electrodes in each layer are connected by the interlayer connection electrodes so as to define a single linear electrode. Each of the ends of the spiral electrode is connected to an external connection electrode provided on a corresponding one of opposing end surfaces of the housing.

The mounted circuit element 430 having such a structure is mounted on the top surface 100S of the multilayer substrate 100 so that a center axis of the spiral electrode is perpendicular or substantially perpendicular to the top surface 100S. Here, the connection line between the first connection terminal P21' and the first external connection terminal P1 of the filter section 21 is provided on the top surface 100S of and within the multilayer substrate 100, and a ground electrode is provided within the multilayer substrate 100. The connection line and the ground electrode are connected to mounting lands of the mounted circuit element 430. As a result, a structure in which the inductor 43L is connected between the ground and the connection line between the first connection terminal P21' and the first external connection terminal P1 of the filter section 21 is realized.

Note that the inductor 43L may be realized by a linear electrode provided on the top surface 100S of the multilayer substrate 100.

The mounted circuit element 430 that realizes the inductor 43L and the linear electrode that defines the inductor 70 are disposed nearby each other. For example, the inductor 43L and the linear electrode that defines the inductor 70 are disposed at a distance of about 50 μm to about 150 μm from one another. Accordingly, inductive coupling is able to be generated between the inductor 43L including the spiral electrode of the mounted circuit element 430 and the inductor 70 including the linear electrode within the multilayer substrate 100, as indicated by the bold broken line arrow in FIG. 10. Employing such a structure makes it possible to realize the high-frequency module 101 having desired attenuation characteristics without providing a separate element for adjusting the attenuation characteristics.

The degree of coupling between the inductor 43L and the inductor 70 is able to be adjusted by changing the distance between the linear electrode that defines the inductor 70 and the spiral electrode of the inductor 43L. This makes it possible to adjust the attenuation characteristics of the high-frequency module 101, which in turn makes it possible to more accurately achieve the desired attenuation characteristics.

Figure 11:
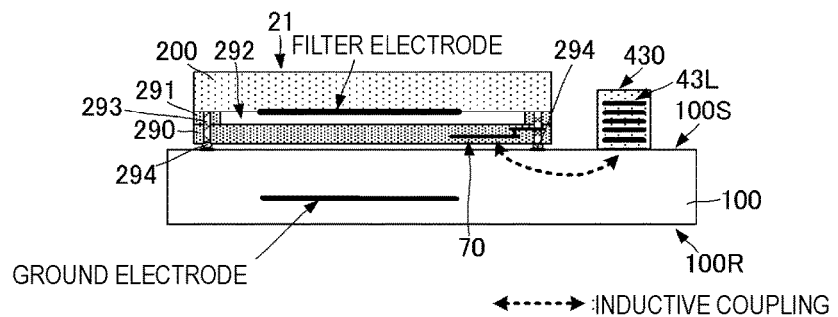
FIG. 11 is a conceptual diagram illustrating the primary structure of a variation on the first structure of the high-frequency module from the side.

Note that the inductor 70 may be provided on the cover layer 290 rather than within the multilayer substrate 100, as illustrated in FIG. 11. The inductor 70 includes a partially-segmented tubular linear electrode. The mounted circuit element 430 that realizes the inductor 43L and the linear electrode that defines the inductor 70 are disposed nearby each other. For example, the mounted circuit element 430 that realizes the inductor 43L and the linear electrode that defines the inductor 70 are disposed at a distance of about 50 μm to about 150 μm from one another. As a result, in the same manner as described above, inductive coupling is able to be produced between the inductor 43L and the inductor 70 as indicated by the bold broken line arrow in FIG. 10.

Second Structure

Figure 12:
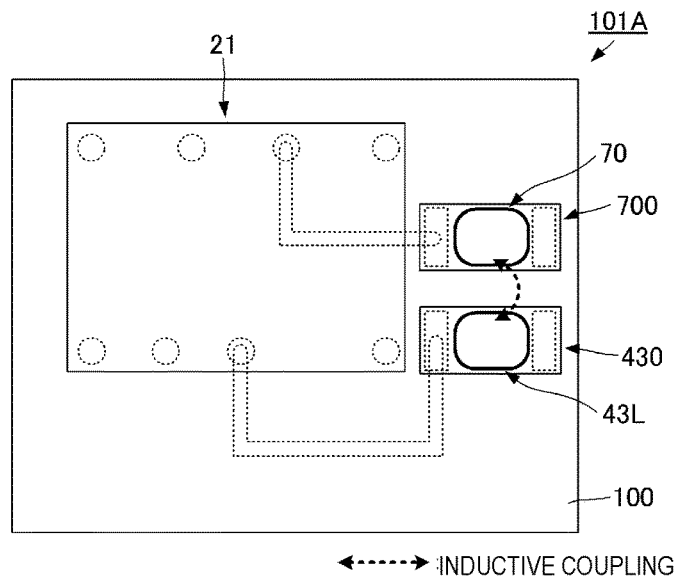
FIG. 12 is a conceptual diagram illustrating the primary structure in a second structure of a high-frequency module in plan view.

FIG. 12 is a conceptual diagram illustrating the primary structure of a high-frequency module in plan view. A high-frequency module 101A includes the filter section 21, the multilayer substrate 100, and mounted circuit elements 430 and 700.

The filter section 21 and the mounted circuit elements 430 and 700 are mounted on the top surface (mounting surface) of the multilayer substrate 100.

According to the second structure, the filter section 21 has the WLP structure indicated in the first structure. The mounted circuit element 430 preferably has the same structure as the first structure. In other words, the mounted circuit element 430 includes the rectangular or substantially rectangular parallelepiped housing made of an insulative material, and the spiral electrode defining and functioning as the inductor 43L is provided within that housing. The mounted circuit element 700 includes a rectangular or substantially rectangular parallelepiped housing made of an insulative material, and a spiral electrode defining and functioning as the inductor 70 is provided within that housing. Other constituent elements are the same as those of the mounted circuit element 430.

To realize the circuit structure illustrated in FIG. 8, the filter section 21 and the mounted circuit elements 430 and 700 are connected by a wiring pattern provided on the top surface and in inner layers of the multilayer substrate 100.

The mounted circuit elements 430 and 700 are disposed so that a lengthwise side surface of the mounted circuit element 430 and a lengthwise side surface of the mounted circuit element 700 oppose each other at close proximity. For example, the lengthwise side surface of the mounted circuit element 430 and the lengthwise side surface of the mounted circuit element 700 oppose each other at a distance of about 50 μm to about 150 μm from one another. Accordingly, inductive coupling is able to be produced between the inductor 43L defined by the spiral electrode of the mounted circuit element 430 and the inductor 70 constituted of the spiral electrode of the mounted circuit element 700, as indicated by the bold broken line arrow in FIG. 12. At this time, the degree of coupling between the inductor 43L and the inductor 70 is able to be adjusted by adjusting the distance between the mounted circuit element 430 and the mounted circuit element 700, the orientations of the mounted circuit elements 430 and 700, or the like. This makes it possible to adjust the attenuation characteristics of the high-frequency module 101A, which in turn makes it possible to more accurately achieve the desired attenuation characteristics.

FIG. 12 illustrates an example in which the mounted circuit element 430 and the mounted circuit element 700 are disposed so that the lengthwise side surfaces thereof oppose each other. However, these elements may be disposed so that a widthwise side surface of the mounted circuit element 430 (an end surface in which an external connection electrode is formed) and the lengthwise side surface of the mounted circuit element 700 oppose each other. However, it is easier to achieve stronger inductive coupling by disposing the mounted circuit element 430 and the mounted circuit element 700 so that the lengthwise side surfaces thereof oppose each other.

In addition, although FIG. 12 illustrates an example in which the mounted circuit elements 430 and 700 are mounted so that center axes of the spiral electrodes are perpendicular or substantially perpendicular to the top surface of the multilayer substrate 100, the mounted circuit elements 430 and 700 may be mounted so that the center axes of the spiral electrode are parallel or substantially parallel to the top surface of the multilayer substrate 100.

Third Structure

Figure 13:
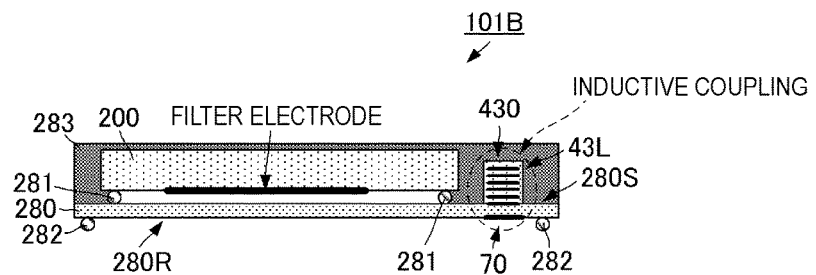
FIG. 13 is a conceptual diagram illustrating the primary structure in a third structure of a high-frequency module from the side.

FIG. 13 is a conceptual diagram illustrating the primary structure of a high-frequency module from the side. A high-frequency module 101B illustrated in FIG. 13 has what is known as a CSP (Chip Sized Package) structure.

The high-frequency module 101B includes the filter substrate 200. Filter electrodes, a wiring pattern, and the like to realize the filter section 21 as described above are provided on the first main surface of the filter substrate 200.

The high-frequency module 101B further includes a filter mounting substrate 280. The filter mounting substrate 280 is made of an alumina substrate, for example, and when viewed in plan view, has a surface area that is larger by a predetermined amount than the filter substrate 200. A predetermined electrode pattern is provided on the filter mounting substrate 280.

The filter substrate 200 is mounted on a top surface (mounting surface) 280S of the filter mounting substrate 280 using a bump conductor 281, so that the first main surface of the filter substrate 200 is located on the filter mounting substrate 280 side. In addition, the mounted circuit element 430 that defines the inductor 43L is mounted on the top surface 280S of the filter mounting substrate 280. The linear electrode that defines the inductor 70 and an external connection bump conductor 282 are provided on a bottom surface 280R of the filter mounting substrate 280.

A resin layer 283 is applied to the top surface 280S of the filter mounting substrate 280. However, the resin layer 283 is not applied to the interdigital transducer electrodes, and the interdigital transducer electrode portion has a hollow structure. This makes it possible to prevent the filter electrodes and the wiring pattern from being exposed to the external environment, which in turn makes it possible to improve the resonance characteristics of the SAW resonators and accurately realize desired characteristics as a filter.

Here, the spiral electrode that defines the inductor 43L and the linear electrode that defines the inductor 70 overlap at least partially when viewed in plan view. Accordingly, inductive coupling is able to be produced between the inductor 43L and the inductor 70, as illustrated in FIG. 13. In particular, according to the structure of the present preferred embodiment, a gap (distance) between the spiral electrode that defines the inductor 43L and the linear electrode that defines the inductor 70 is able to be reduced, which makes it possible to easily achieve stronger inductive coupling.

Furthermore, because the high-frequency module 101B as a whole has a CSP structure, the high-frequency module 101B is able to be made smaller and thinner.

In the above-described example, the inductor 43L that provides matching with an antenna is realized by the mounted circuit element 430 mounted on the top surface 100S of the multilayer substrate 100, and this may be realized as follows.

Fourth Structure

Figure 14:
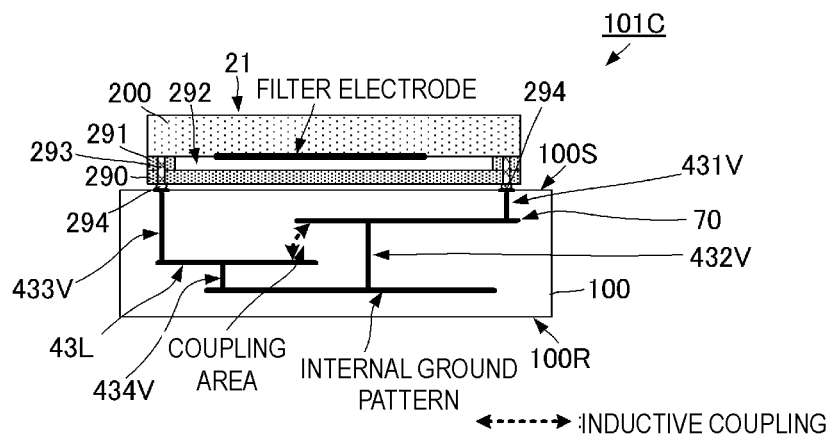
FIG. 14 is a conceptual diagram illustrating the primary structure in a fourth structure of a high-frequency module from the side.
Figure 15:
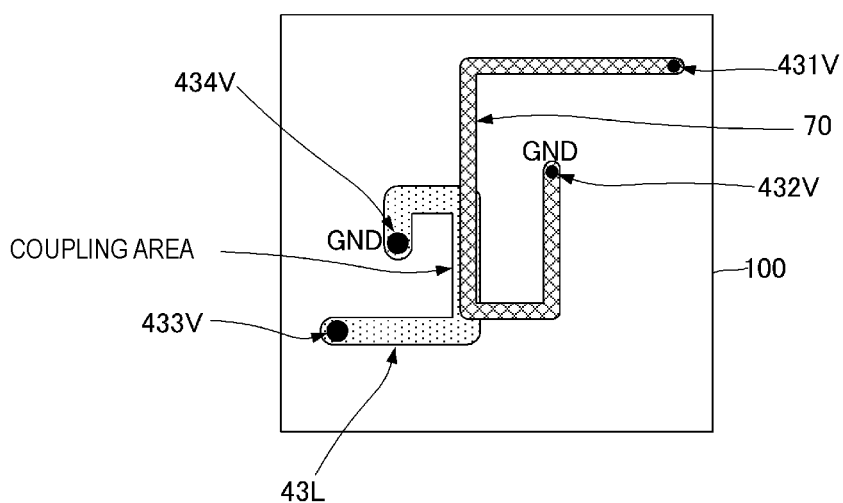
FIG. 15 is a conceptual diagram illustrating the primary structure in the fourth structure of a high-frequency module in plan view.

FIG. 14 is a conceptual diagram illustrating the primary structure of a high-frequency module from the side. FIG. 15 is a conceptual diagram illustrating the primary structure of a high-frequency module in plan view. The primary structure of a high-frequency module 101C illustrated in FIGS. 14 and 15 differs from the primary structure of the high-frequency module 101 illustrated in FIG. 10 in that the inductor 43L is provided within the multilayer substrate 100 and in that the wiring pattern of the inductor 70 is different. Note that FIG. 15 is a diagram illustrating the multilayer substrate 100 from the filter section 21 side, and an internal ground pattern thereof is not shown in order to facilitate the descriptions.

As illustrated in FIGS. 14 and 15, the inductor 43L is preferably realized by providing a linear electrode within the multilayer substrate 100. One end of the linear electrode that defines the inductor 43L is connected, through a via conductor 433V, to a land electrode on which the mounting electrode 294 that defines and functions as the first connection terminal P21' is mounted. Another end of the linear electrode that defines the inductor 43L is connected, through a via conductor 434V, to an internal ground pattern provided within the multilayer substrate 100.

As illustrated in FIG. 14, the linear electrode that defines the inductor 43L is provided on a different layer from the linear electrode that defines the inductor 70. As indicated by the plan view illustrated in FIG. 15, the linear electrode that defines the inductor 43L and the linear electrode that defines the inductor 70 are disposed so as to partially follow each other in an overlapping manner. The inductor 43L and the inductor 70 are disposed nearby each other as a result. For example, the inductor 43L and the inductor 70 are disposed at a distance of about 30 μm to about 150 μm from one another.

According to the high-frequency module 101C illustrated in FIGS. 14 and 15, strong inductive coupling occurs between the inductor 43L and the inductor 70 by disposing the inductor 43L and the inductor 70 nearby each other within the multilayer substrate 100. Furthermore, according to the high-frequency module 101C illustrated in FIGS. 14 and 15, providing the inductor 43L within the multilayer substrate 100 reduces the mounting surface area as compared to the high-frequency module 101 illustrated in FIG. 10, which makes the high-frequency module 101C smaller. Furthermore, the inductor 43L and the inductor 70 overlap in the laminating direction of the multilayer substrate 100, which further reduces the mounting surface area.

As illustrated in FIGS. 14 and 15, the linear electrode that defines the inductor 43L and the linear electrode that defines the inductor 70 are disposed so as to have opposite high-frequency signal transmission directions at a coupling area. The effective inductance value of the inductor 70 increases as a result of the opposite transmission directions at the area of inductive coupling. This makes it possible to shorten the linear electrode that defines the inductor 70 and further reduce the size of the high-frequency module 101C.

Although the respective aforementioned structures describe examples in which an inductor is preferably used as the matching element, the same structures can be realized in the case where the matching element is a capacitor as well. For example, a mounted laminated capacitor element may be used instead of the mounted circuit element 430 having the spiral electrode.

Meanwhile, the coupling between the matching element and the inductor can have a greater effect on the attenuation characteristics by increasing the number of SAW resonators interposed therebetween. For example, in the first structure (see FIG. 10), even with the same positional relationship between the linear electrode that defines the inductor 70 and the mounted circuit element 430, the effect on the attenuation characteristics is able to be increased by causing the matching element and the inductor to couple with a greater number of SAW resonators interposed therebetween. Note that the matching elements 41, 42, 43, and 44 are not limited to a single element, and may be composite circuits each including a plurality of inductors, a plurality of capacitors, or a plurality of elements combining inductors and capacitors.

In addition, although the above-described filter section is what is known as a ladder connection filter, the filter section 20 may be a longitudinally coupled resonator filter instead, for example. Even in this case, a high-frequency module having desired attenuation characteristics is able to be achieved by adjusting the inductive coupling or capacitive coupling between the above-described matching element and the inductor.

In addition, various preferred embodiments of the present invention can also be applied in a high-frequency module using what is known as a bare chip-type filter section.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a first external connection terminal;
   a second external connection terminal;
   a filter section connected between the first external connection terminal and the second external connection terminal; and
   a matching element connected between the filter section and at least one of the first external connection terminal and the second external connection terminal; wherein
   the filter section includes:
      a first connection terminal connected to the first external connection terminal;
      a second connection terminal connected to the second external connection terminal;

a plurality of first filter elements connected in series between the first connection terminal and the second connection terminal; and a first inductor; wherein the first inductor is inductively coupled or capacitively coupled to the matching element, and the first inductor is connected in parallel to a first filter element, among the plurality of the first filter elements, that is different from a first filter element directly connected to the matching element; and the first inductor and the matching element are located such that there is no other element or a wiring pattern provided therebetween.

2. The high-frequency module according to claim 1, wherein the filter section includes a sixth connection terminal and a second filter section; and the second filter section is connected between the sixth connection terminal and a connection line connecting the first connection terminal and the first filter element, or is connected between the sixth connection terminal and a connection line connecting the second connection terminal and the first filter element.

3. The high-frequency module according to claim 1, wherein the filter section includes:

a fourth connection terminal; and a fifth connection terminal; wherein the first inductor is connected in parallel to the first filter element through the fourth connection terminal and the fifth connection terminal.

4. The high-frequency module according to claim 1, wherein inductive coupling or capacitive coupling produced by the first inductor changes impedance outside a pass band of the filter section.

5. The high-frequency module according to claim 1, wherein inductive coupling or capacitive coupling produced by the first inductor changes an attenuation pole frequency outside a pass band of the filter section.

6. The high-frequency module according to claim 1, wherein the matching element is a series-connected matching element connected in series between the first external connection terminal and the first connection terminal or connected in series between the second external connection terminal and the second connection terminal.

7. The high-frequency module according to claim 1, wherein the matching element is a shunt-connected matching element connected between a ground and a connection line connecting the first external connection terminal and the first connection terminal or connected between a ground and a connection line connecting the second external connection terminal and the second connection terminal.

8. The high-frequency module according to claim 1, wherein the filter section includes an interdigital transducer electrode;

the high-frequency module further comprises:

a planar filter substrate in which the interdigital transducer electrode is provided on a first main surface;

a planar cover layer that opposes the first main surface of the filter substrate with a gap between the cover layer and the first main surface;

a connection electrode that protrudes from the first main surface and passes through the cover layer; and a multilayer substrate where the first inductor is mounted or located; and the filter substrate is disposed so that the first main surface side of the filter substrate faces a mounting surface of the multilayer substrate; and the filter substrate is connected to the multilayer substrate through the connection electrode.

9. The high-frequency module according to claim 8, wherein the matching element includes a mounted circuit element mounted on the mounting surface of the multilayer substrate;

the first inductor is mounted on the mounting surface of the multilayer substrate or located within the multilayer substrate; and the mounted circuit element and the first inductor are disposed nearby each other.

10. The high-frequency module according to claim 9, wherein the mounted circuit element is directly adjacent to the first inductor.

11. The high-frequency module according to claim 9, wherein the matching element includes:

a rectangular or substantially rectangular parallelepiped housing; and a spiral conductor, provided within the housing, that has a rectangular or substantially rectangular outer circumferential shape when seen in plan view; wherein the matching element is disposed so that a long side of the housing is nearby the first inductor.

12. The high-frequency module according to claim 8, wherein the matching element is a matching inductor connected in parallel to an antenna; and the matching inductor and the first inductor are provided within the multilayer substrate so as to be nearby each other.

13. The high-frequency module according to claim 12, wherein the matching inductor and the first inductor are linear electrodes provided on mutually different layers of the multilayer substrate;

the linear electrode that defines the matching inductor includes an overlapping portion that overlaps with the linear electrode that defines the first inductor when viewed in a laminating direction of the multilayer substrate.

14. The high-frequency module according to claim 13, wherein the linear electrode that defines the matching inductor and the linear electrode that defines the first inductor have opposite high-frequency signal transmission directions in the overlapping portion.

15. The high-frequency module according to claim 8, wherein the matching element includes a matching inductor connected in series to an antenna; and the matching inductor and the first inductor are provided within the multilayer substrate so as to be nearby each other.

16. The high-frequency module according to claim 15, wherein the matching inductor and the first inductor are linear electrodes provided on mutually different layers of the multilayer substrate;

the linear electrode that defines the matching inductor includes an overlapping portion that overlaps with the linear electrode that defines the first inductor when viewed in a laminating direction of the multilayer substrate.

17. The high-frequency module according to claim 16, wherein the linear electrode that defines the matching inductor and the linear electrode that defines the first inductor have opposite high-frequency signal transmission directions in the overlapping portion.

18. The high-frequency module according to claim 1, wherein
the filter section includes an interdigital transducer electrode;
the high-frequency module further comprises:
a planar filter substrate in which the interdigital transducer electrode includes a first main surface; and
a planar filter mounting substrate, disposed on the first main surface side of the filter substrate, to which the filter substrate is mounted on the first main surface side; and
the matching element is mounted on, mounted in, formed on, or formed in the mounting surface of the filter mounting substrate.

19. A high-frequency module comprising:
a first external connection terminal;
a second external connection terminal;
a filter section connected between the first external connection terminal and the second external connection terminal; and
a matching element connected between the filter section and at least one of the first external connection terminal and the second external connection terminal; wherein
the filter section includes:
a first connection terminal connected to the first external connection terminal;
a second connection terminal connected to the second external connection terminal;
a third connection terminal connected to a ground;
a plurality of first filter elements connected in series between the first connection terminal and the second connection terminal; and
a second filter element connected at one end to a connection line connecting the first connection terminal and at least one of the first filter elements, a connection line connecting the second connection terminal and at least one of the first filter elements, or a connection line connecting mutually-adjacent first filter elements, and connected at another end to the third connection terminal; wherein
the high-frequency module further includes a first inductor connected in parallel to a first filter element of the plurality of first filter elements;
a second inductor is connected between the third connection terminal and the ground;
the first inductor and the second inductor are inductively coupled; and
the first inductor and the matching element are located such that there is no other element or a wiring pattern provided therebetween.

20. The high-frequency module according to claim 19, further comprising:
a third filter element connected at one end to a connection line aside from the connection line to which the one end of the second filter element is connected, and connected at another end to the third connection terminal.

21. A high-frequency module comprising:
a first external connection terminal;
a second external connection terminal;
a filter section connected between the first external connection terminal and the second external connection terminal; and
a matching element connected between the filter section and at least one of the first external connection terminal and the second external connection terminal; wherein
the filter section includes:
a first connection terminal connected to the first external connection terminal;
a second connection terminal connected to the second external connection terminal;
a plurality of first filter elements connected in series between the first connection terminal and the second connection terminal; and
a first inductor;
the first inductor is inductively coupled or capacitively coupled to the matching element, and the first inductor is connected in parallel to a first filter element, among the plurality of the first filter elements, that is different from a first filter element directly connected to the matching element;
the filter section includes an interdigital transducer electrode;
the high-frequency module further comprises:
a planar filter substrate in which the interdigital transducer electrode is provided on a first main surface;
a planar cover layer that opposes the first main surface of the filter substrate with a gap between the cover layer and the first main surface;
a connection electrode that protrudes from the first main surface and passes through the cover layer; and
a multilayer substrate; wherein
the filter substrate is disposed so that the first main surface side of the filter substrate faces a mounting surface of the multilayer substrate;
the filter substrate is connected to the multilayer substrate through the connection electrode;
the matching element includes a mounted circuit element mounted on the mounting surface of the multilayer substrate;
the first inductor is provided within the cover layer; and
the mounted circuit element and the first inductor are disposed nearby each other.

* * * * *